United States Patent
Nii

(10) Patent No.: US 7,170,812 B2
(45) Date of Patent: Jan. 30, 2007

(54) SEMICONDUCTOR MEMORY DEVICE CAPABLE OF REDUCING POWER CONSUMPTION DURING READING AND STANDBY

(75) Inventor: Koji Nii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/304,817

(22) Filed: Dec. 16, 2005

(65) Prior Publication Data

US 2006/0092746 A1    May 4, 2006

Related U.S. Application Data

(63) Continuation of application No. 10/895,092, filed on Jul. 21, 2004, now Pat. No. 6,999,371.

(30) Foreign Application Priority Data

Jul. 24, 2003   (JP)   ............................. 2003-279239

(51) Int. Cl.
*G11C 5/14* (2006.01)
(52) U.S. Cl. .................. 365/227; 365/189.07; 365/154
(58) Field of Classification Search ................ 365/227, 365/205, 154, 189.07
See application file for complete search history.

(56) References Cited

U.S. PATENT DOCUMENTS

| 5,053,998 | A | | 10/1991 | Kannan et al. |
| 5,715,191 | A | | 2/1998 | Yamaguchi et al. |
| 5,873,112 | A | * | 2/1999 | Norman ...................... 711/103 |
| 6,999,371 | B2 | * | 2/2006 | Nii .............................. 365/227 |

FOREIGN PATENT DOCUMENTS

| JP | 9-274796 | 10/1997 |
| JP | 11-120760 | 4/1999 |
| JP | 2002-366419 A | 12/2002 |

* cited by examiner

*Primary Examiner*—Huan Hoang
(74) *Attorney, Agent, or Firm*—McDermott Will & Emery LLP

(57) ABSTRACT

The input data at address 0 is "00000000", including many "0"s. The data at address 0 is inverted to "11111111". At the same time, flag information "1" indicative of inversion is written into the flag bit of the same address 0. The input data at address 3 also includes many "0"s. Therefore, the data of address 3 is inverted, and flag information "1" is written. The input data at addresses 1 and 2 includes more "1"s than "0"s. Therefore, the data is not inverted, and flag information "0" is written. With regards to the written data, only the data at an address whose flag signal is "1" is inverted again in a reading mode to be eventually read out as a data output signal.

2 Claims, 13 Drawing Sheets

SEMICONDUCTOR MEMORY DEVICE CAPABLE OF REDUCING POWER CONSUMPTION DURING READING AND STANDBY

RELATED APPLICATIONS

This application is a continuation of application Ser. No. 10/895,092, filed Jul. 21, 2004 now U.S. Pat. No. 6,999,371, which claims priority of Japanese Application No. 2003-279239, filed Jul. 24, 2003, the contents of which are hereby incorporated by reference.

BACKGROUND OF THE INVENTION

1. Field of the Invention

The present invention relates to semiconductor memory devices, particularly a semiconductor memory device that can retain stored data without executing a refresh operation.

2. Description of the Background Art

A scheme of reducing power consumption in a random access memory during data writing is disclosed in Japanese Patent Laying-Open No. 2002-366419.

The conventional data processor disclosed in the aforementioned publication detects the number of "0"s and the number "1"s during data writing, and writes, when the number of "0"s is low, inverted data together with flag information indicative of whether data has been inverted or not. In a reading mode, the data is inverted in accordance with the flag information. Since the frequency of inverting data stored in the memory cell is reduced, power consumption in a data writing mode can be reduced.

The conventional data processor disclosed in the aforementioned publication includes a circuit comparing the number of "0"s and the number of "1"s using an adder. In the case where multi-bit data is input, the number of stages of logic circuits will be increased. This poses the problem that the delay time is increased and the circuit complexity becomes higher. The aforementioned publication corresponding to a data processor fails to teach a specific circuit configuration of the memory.

In the case where a memory block is formed of memory cells of a general single port SRAM (Static Random Access Memory) in the conventional data processor disclosed in the aforementioned publication, the potential level of one of bit lines forming a pair will always be altered in a reading operation. Thus, there was a problem that power is consumed by the charging/discharging operation of a bit line every time reading is conducted.

In a data processor such as the type disclosed in the aforementioned publication, data stored through one writing operation is often read out subsequently many times. This means that the access frequency of the microprocessor in such a data processor to a memory cell is higher in a read out operation than in a write operation. It is therefore more effective to reduce the power consumption during a reading mode than in a writing mode in order to reduce the power consumption during memory access. However, the conventional data processor disclosed in the aforementioned publication is directed to reduce power consumption during a writing operation. Such a data processor is disadvantageous in that power consumption during a reading operation is not lowered.

Reflecting the microminiaturization of semiconductor integrated circuits, the SRAM mounting complexity on one chip has become higher. In accordance with the higher SRAM mounting complexity, a plurality of memory blocks will be mounted within one chip. As a result, not only the power consumption due to a reading or writing operation in a memory block that is accessed, i.e. in an operation state, but also power consumption caused by standby leakage current in a memory block that is not accessed, i.e. in a standby state, will become greater.

When the gate length of an MOS transistor becomes less than 1 μm in accordance with microminiaturization of semiconductor integrated circuits, the gate insulation film will also become as thin as approximately 10–20 Å. Accordingly, the gate tunnel leakage current that was negligible so far increases, resulting in further increase of the standby leakage current in a standby state. Therefore, lowering the standby leakage current in the SRAM has become an important element in reducing the power consumption of the entire chip. The conventional data processor disclosed in the aforementioned publication is directed to reducing power consumption in a writing operation, and is not directed to reducing the power consumption in a standby state.

In the case where a memory block is formed of memory cells of a general single port SRAM in a conventional data processor as disclosed in the aforementioned publication, the standby current flowing during a standby state is identical irrespective of whether the retaining data (write data) is 0 or 1. The effect of reducing the flow of standby leakage current during a standby state could not be achieved by just inverting the write data as in the conventional data processor disclosed in the aforementioned publication.

SUMMARY OF THE INVENTION

An object of the present invention is to provide a semiconductor memory device that can have power consumption reduced in a reading mode and a standby mode.

According to an aspect of the present invention, a semiconductor memory device includes a memory cell array having a plurality of memory cells arranged in rows and columns, a data input circuit receiving a data signal, inverting the data signal when the number of one of logic values is greater than the number of the other of logic values in the data signal, and writing the inverted or non-inverted data signal and a flag signal, indicating whether the data signal is inverted or non-inverted, of the data signal, into the memory cells, and a data output circuit reading out the inverted or non-inverted data signal and the flag signal of the data signal from the memory cells and re-inverting the inverted or non-inverted data signal when the flag signal indicates inversion. Each of the plurality of memory cells includes a data storage unit storing data, and a readout port unit reading out data from the data storage unit. The readout port unit includes a readout word line arranged in a row direction, a readout bit line arranged in a column direction, a first transistor having a source connected to a first power supply line and a gate connected to the data storage unit, and a second transistor connected between the first transistor and the readout bit line, and having a gate connected to the readout word line.

In accordance with the present invention, power consumption can be reduced in a reading mode and a standby mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
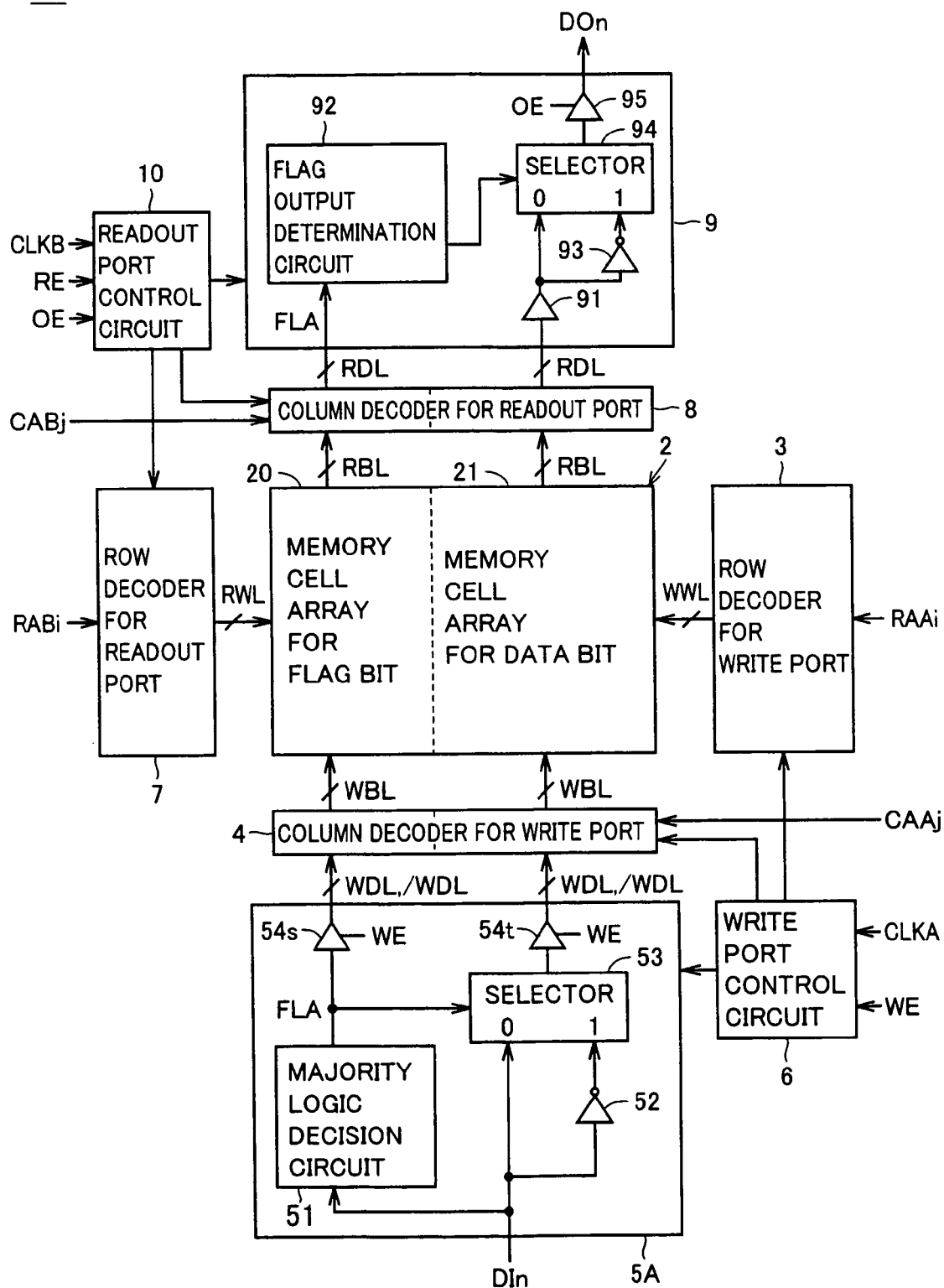
FIG. 1 is a block diagram schematically showing a structure of a semiconductor memory device 1A according to a first embodiment of the present invention.

Embodiments of the present invention will be described in detail hereinafter with reference to the drawings. In the drawings, the same or corresponding elements have the same reference characters allotted, and description thereof will not be repeated.

First Embodiment

Referring to FIG. 1, a semiconductor memory device 1A according to a first embodiment of the present invention includes a memory cell array 2, a row decoder 3 for a write port, a column decoder 4 for a write port, a data input circuit 5A, a write port control circuit 6, a row decoder 7 for a readout port, a column decoder 8 for a readout port, a data output circuit 9, and a readout port control circuit 10. Memory cell array 2 is a 2-port memory cell array, including a flag bit memory cell array 20, and a data bit memory cell array 21. A specific configuration of memory cell array 2 will be described afterwards.

Write port row decoder 3 renders a corresponding write word line WWLi active in accordance with a row address signal RAAi (i=1–m: m is an integer of at least 0) for a write port. The subscript i may be omitted when the designation is provided generically.

Data input circuit 5A includes a majority logic decision circuit 51, an inverter circuit 52, a selector 53, and write driver circuits 54s and 54t.

Majority logic decision circuit 51 receives a data input signal DIn of n bits (n is a natural number) to decide the majority of the numbers of 0s and the number of 1s as to the logic values in the current data input signal DIn.

When the number of 1s is equal to or greater than the number of 0s, majority logic decision circuit 51 outputs a flag signal FLA of 0 to selector 53 and write driver circuit 54s. When the number of 0s is greater than the number of 1s, majority logic decision circuit 51 outputs a flag signal FLA of 1 to selector 53 and write driver circuit 54s.

Inverter circuit 52 inverts data input signal DIn. Selector 53 receives a non-inverted signal and an inverted signal of data input signal DIn. When flag signal FLA indicates 0, selector 53 selects the non-inverted signal of data input signal DIn and outputs that non-inverted signal to write driver circuit 54t. When flag signal FLA indicates 1, selector 53 selects the inverted signal of data input signal DIn and outputs that inverted signal to write drive circuit 54t.

Write driver circuit 54s responds to a write control signal WE to write flag signal FLA at the address specified by flag bit memory cell array 20 via a write data line pair WDL, /WDL. Write driver circuit 54t responds to write control signal WE to write a non-inverted signal or an inverted signal of data input signal DIn at the address specified in data bit memory cell array 21 via write data line pair WDL, /WDL. A specific circuit configuration of a write driver circuit 54 representative of write driver circuits 54s and 54t will be described afterwards.

Write port column decoder 4 writes signal data to memory cell array 2 via a corresponding write bit line pair WBLj in accordance with a write port column address signal CAAj (j=1–k: k is an integer of at least 0). The designation "write bit line WBLj" includes a pair of write bit lines WBLj and /WBLj. The subscript j may be omitted when the designation is provided generically.

Write port control circuit 6 receives a write port clock signal CLKA and write control signal WE to control write port row decoder 3, write port column decoder 4, and data input circuit 5A. The writing operation is carried out in synchronization with write port clock signal CLKA. Write control signal WE is provided to control the writing of data input signal DIn.

Readout port row decoder 7 renders a corresponding readout word line RWLi active in accordance with a readout port row address signal RABi (i=1–m: m is an integer of at least 0). The subscript i may be omitted when the designation is provided generically.

Readout port column decoder 8 reads out signal data from memory cell array 2 via a corresponding readout bit line pair RBLj in accordance with a readout port column address signal CABj (j=1–k: k is an integer of at least 0). The designation "readout bit line RBLj" includes a pair of readout bit lines RBLj and /RBLj. The subscript j may be omitted when the designation is provided generically.

Data output circuit 9 includes a sense amplifier circuit 91, a flag output determination circuit 92, an inverter circuit 93, a selector 94 and a tristate buffer circuit 95.

Sense amplifier circuit 91 receives a data bit signal from readout data line RDL to sequentially determine whether the current data bit signal is 0 or 1. A specific circuit configuration of sense amplifier circuit 91 will be described afterwards. Flag output determination circuit 92 receives a flag signal FLA from readout data line RDL to determine whether the current flag signal FLA is 0 or 1. The determination result is output to selector 94.

Inverter circuit 93 inverts the output signal from sense amplifier circuit 91. Selector 94 receives a non-inverted signal of the output from sense amplifier circuit 91, and an inverted signal of the output from sense amplifier circuit 91.

When the determination result of flag signal FLA is 0, selector 94 selects the non-inverted signal of the output from sense amplifier circuit 91 and outputs the same to tristate buffer circuit 95. When flag signal FLA indicates 0, a non-inverted signal of data input signal DIn is written at the specified address in data bit memory cell array 21. Therefore, by selecting the non-inverted signal of the output from sense amplifier circuit 91, the data can be restored to the original data input signal DIn.

When the determination result of flag signal FLA is 1, selector 94 selects an inverted signal of the output from sense amplifier circuit 91 and outputs the same to tristate buffer circuit 95. When flag signal FLA corresponds to 1, an inverted signal of data input signal DIn is written at the specified address in data bit memory cell array 21. Therefore, by selecting an inverted signal of the output from sense amplifier circuit 91, the data can be restored to the original data input signal DIn.

Tristate buffer circuit 95 responds to a data output control signal OE to output a non-inverted signal or an inverted signal of the output from sense amplifier circuit 91 as a data output signal DOn of n bits.

Readout port control circuit 10 receives a readout port clock signal CLKB, a readout control signal RE, and data output control signal OE to control readout port row decoder 7, write port column decoder 8, and data output circuit 9. The reading operation is carried out in synchronization with readout port clock signal CLKB. Readout control signal RE provides control of whether to read out data or not. Data output control signal OE provides control so as to set data output signal DOn at a floating state or not.

A specific configuration of memory cell arrays 2a and 2b that are one example of memory cell array 2 of semiconductor memory device 1A will be described in detail hereinafter.

Figure 2:
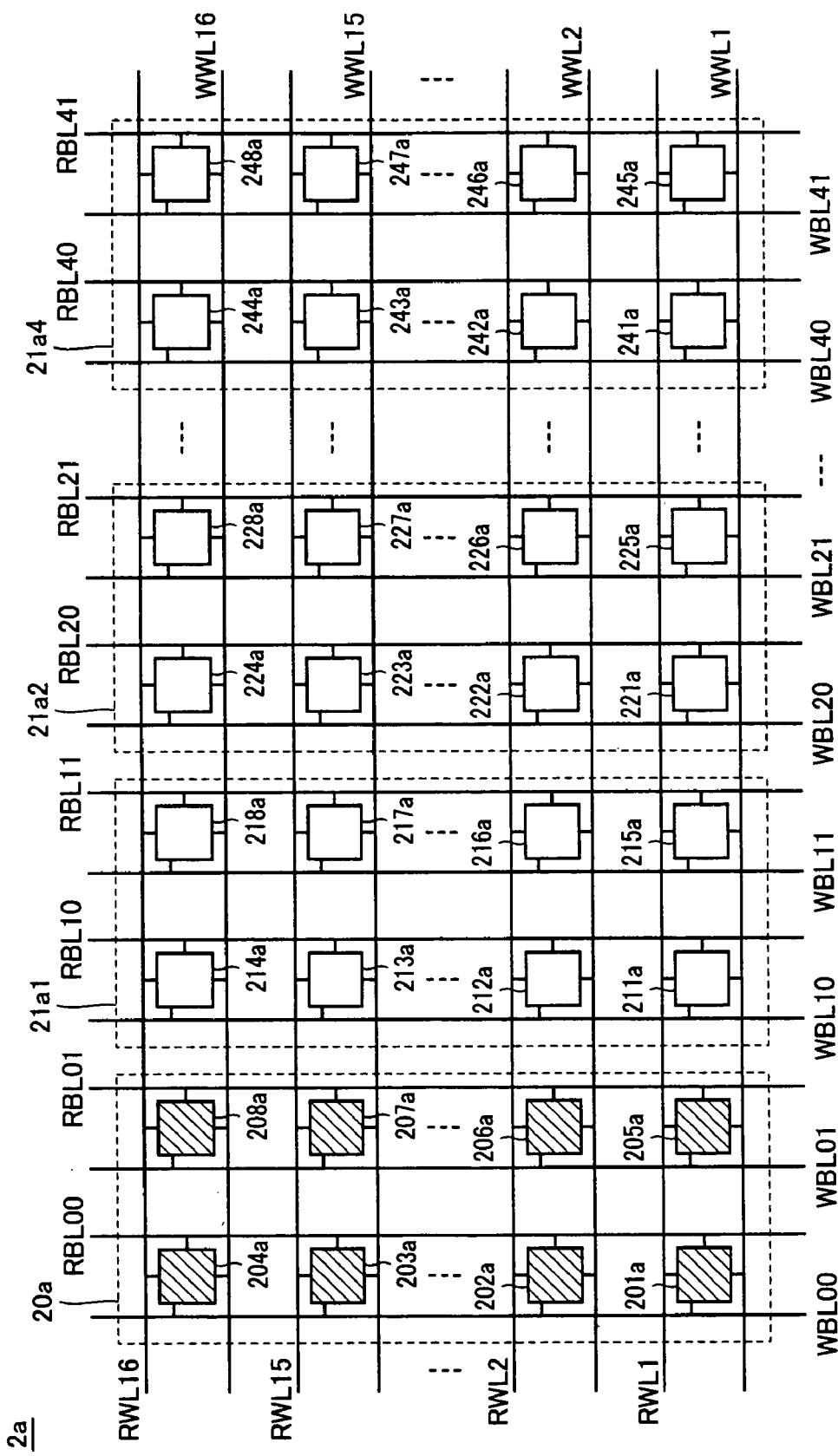
FIG. 2 shows a specific configuration of a memory cell array 2a of the first embodiment.

Referring to FIG. 2, memory cell array 2a of the first embodiment includes a flag bit memory cell array 20a, data bit memory cell arrays 21a1–21a4, a readout word line RWLp and a write word line WWLp (p=1–16) arranged in the row direction, and a readout bit line RBLq and a write bit line WBLq (q=00, 01, 10, 11, . . . , 40, 41) arranged in the column direction. For the sake of convenience, data bit memory cell 21a3 is not depicted in FIG. 2 since its configuration follows the configuration of data bit memory cells 21a1, 21a2 and 21a4. Similarly, readout word line RWLpi and write word line WWLpi (pi=3–14) are not depicted in FIG. 2 for the sake of convenience.

Memory cell array 2a of FIG. 2 is based on a configuration in which, for the sake of simplification, the number of data bits is 4 bits corresponding to data bit memory cell arrays 21a1–21a4, the row address is 4 bits, the column address is 1 bit, and the number of flag bits is 1 bit corresponding to flag bit memory cell array 20a.

Since the row address corresponds to 4 bits, the number of rows that can be selected by write port row decoders 3 or readout port row decoder 7 of FIG. 1 is 16. In other words, the total number of rows in memory cell array 2a is 16 rows, as shown in FIG. 2. Since the column address corresponds to 1 bit, the number of columns that can be selected by write port column decoder 4 or readout port column decoder 8 of FIG. 1 is 2 columns. In other words, the total number of columns of data bit memory cell arrays 21a1-21a4 is 8 columns since there are 2 memory cell columns for 1 data bit and the number of data bits is currently 4 bits. Further, since the flag bit corresponds to 1 bit, the number of flag bit memory cell arrays 20a is 2 columns, based on two columns of memory cells.

Thus, memory cell array 2a composed of flag bit memory cell array 20a and data bit memory cell arrays 21a1-21a4 corresponds to a configuration of 16 rows and 10 columns.

Flag bit memory cell array 20a includes memory cells 201a–208a. Readout bit line RBL00 and write bit line WBL00 are connected common to memory cells 201a–204a. Readout bit line RBL01 and write bit line WBL01 are connected common to memory cells 205a–208a.

Data bit memory cell array 21a1 includes memory cells 211a–218a. Readout bit line RBL10 and write bit line WBL10 are connected common to memory cells 211a–214a. Readout bit line RBL11 and write bit line WBL11 are connected common to memory cells 215a–218a. Data bit memory cell arrays 21a2–21a4 have a configuration similar to that of data bit memory cell array 21a1, and description thereof will not be repeated.

Readout word line RWL1 and write word line WWL1 are connected common to memory cells 201a, 205a, 211a, 215a, . . . , 241a, 245a. The same applies to read out word lines RWL2–RWL16 and write word lines WWL2–WWL16. Therefore, description thereof will not be repeated. For the sale of convenience, the memory cells corresponding to read out word line RWLpi and write word line WWLpi (pi=3–14) are not depicted in FIG. 2.

In FIG. 2, memory cells 201a–208a among memory cells 201–248a are hatched. This is to provide visual differentiation between the memory cells of flag bit memory cell array 20a and the memory cells of data bit memory cell arrays 21a–21a4. Memory cells 201a–248a all have the same configuration.

Figure 3:
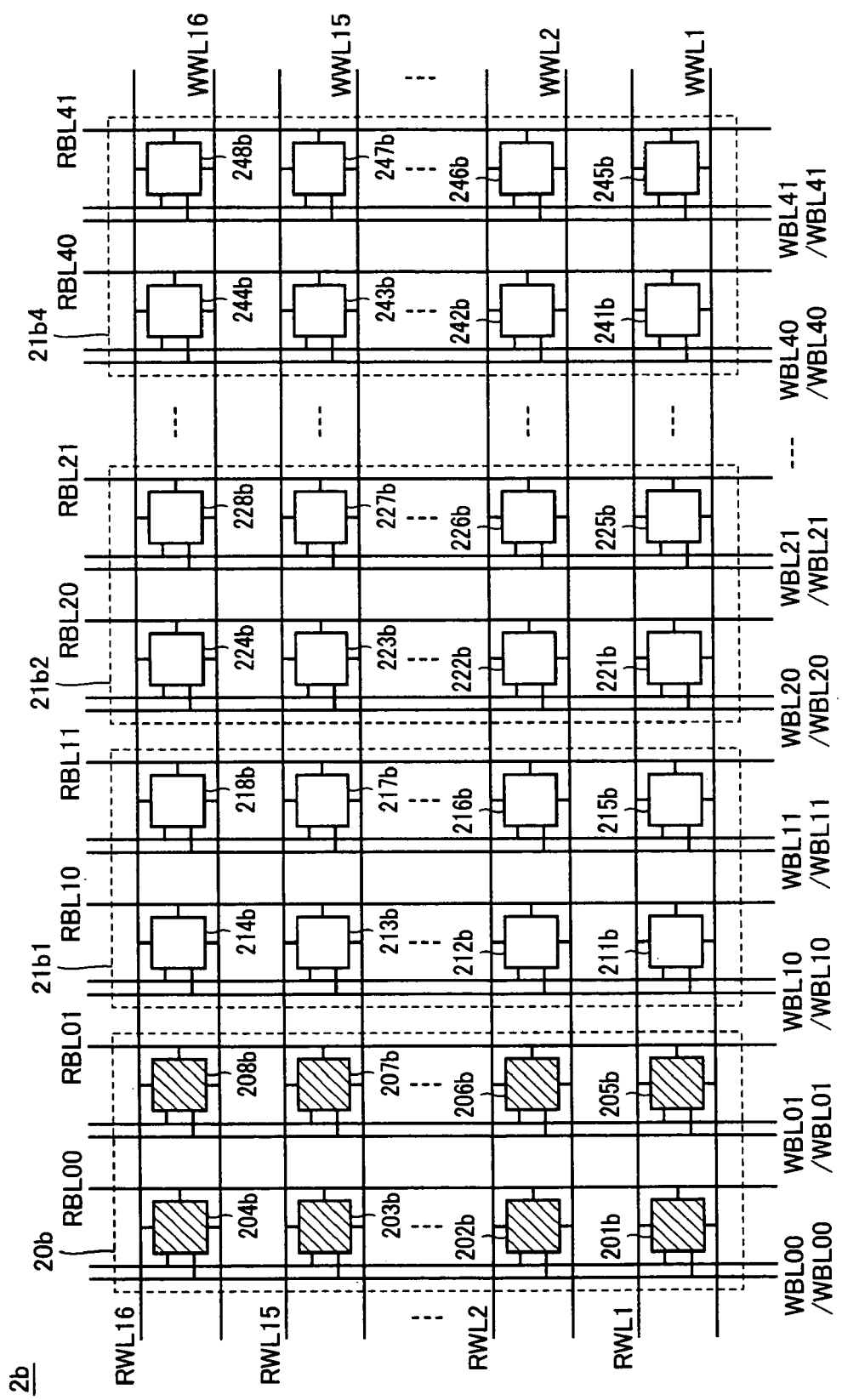
FIG. 3 shows a specific structure of a memory cell array 2b of the first embodiment.

Referring to FIG. 3 showing a specific configuration, memory cell array 2b includes a flag bit memory cell array 20b, data bit memory cell arrays 21b1–21b4, a readout word line RWLp and a write word line WWLp (p=1–16) arranged in the row direction, and a readout bit line RBLq and a pair of write bit lines WBLq, /WBLq (q=00, 01, 10, 11, . . . , 40, 41) arranged in the column direction. For the sake of convenience, data bit memory cell 21b3 is not depicted in FIG. 3 since its configuration follows the configuration of data bit memory cells 21b1, 21b2 and 21b4. Similarly, readout word line RWLpi and write word line WWLpi (pi=3–14) are not depicted in FIG. 3 for the sake of convenience.

Similarly to memory cell array 2a, memory cell array 2b of FIG. 3 is based on a configuration in which the number of data bits is 4 bits corresponding to data bit memory cell arrays 21b1–21b4, the row address is 4 bits, the column address is 1 bit, and the number of flag bits is 1 bit corresponding to flag bit memory cell array 20b.

Thus, memory cell array 2b composed of flag bit memory cell array 20b and data bit memory cell arrays 21b1–21b4 are formed of 16 rows and 10 columns, likewise memory cell array 2a.

Flag bit memory cell array 20b includes memory cells 201b–208b. Readout bit line RBL00 and a pair of write bit lines WBL00, /WBL00 are connected common to memory cells 201b–204b. Readout bit line RBL01 and a pair of write bit lines WBL01, /WBL01 are connected common to memory cells 205b–208b.

Data bit memory cell array 21b1 includes memory cells 211b–218b. Readout bit line RBL10 and a pair of write bit lines WBL10, /WBL10 are connected common to memory cells 211a–214b. Readout bit line RBL11 and a pair of write bit lines WBL11, /WBL11 are connected common to memory cells 215b–218b. Data bit memory cell arrays 21b2–21b4 have a configuration similar to that of data bit memory cell array 21b1. Therefore, description thereof will not be repeated.

Readout word line RWL1 and write word line WWL1 are connected common to memory cells 201b, 205b, 211b, 215b, . . . , 241b and 245b. The same applies to readout word lines RWL2–RWL16 and write word lines WWL2–WWL16. Therefore, description thereof will not be repeated. For the sake of convenience, memory cells corresponding to read word line RWLpi and write word line WWLpi (pi=3–14) are not depicted in FIG. 3.

In FIG. 3, memory cells 201b–208b among memory cells 201b–248b are hatched. This is to provide visual differentiation between the memory cells in flag bit memory cell array 20b and the memory cells in data bit memory cell arrays 21b1–21b4. Memory cells 201b–248b all have the same configuration.

By the configuration of memory cell arrays 2a and 2b as set forth above, the data bit and information of the flag bit can be written simultaneously at the specified address. Further, the data bit and the information of the flag bit at the specified address can be read out simultaneously.

A specific circuit configuration of memory cell 200a representative of memory cells 201a–248a in memory cell array 2a, and memory cell 200b representative of memory cells 201b–248b in memory cell array 2b will be described in detail hereinafter.

Figure 4:
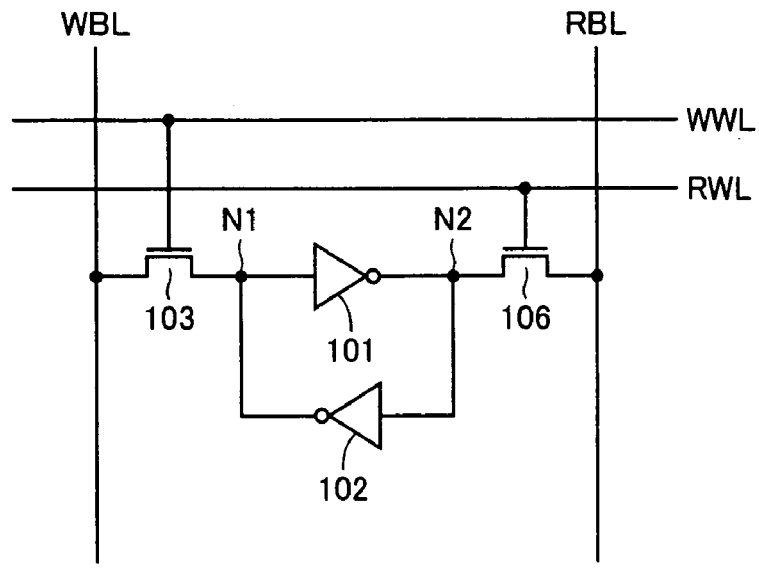
FIG. 4 is a circuit diagram showing a specific configuration of a memory cell 200a of the first embodiment.

FIG. 4 is a circuit diagram showing a specific configuration of memory cell 200a of the first embodiment.

Referring to FIG. 4, memory cell 200a of the first embodiment includes inverters 101 and 102 connected in a cyclic manner to each other between storage nodes N1 and N2, an N channel MOS transistor 103 connected between storage node N1 and write bit line WBL, having its gate connected to write word line WWL, and an N channel MOS transistor 106 connected between storage node N2 and readout bit line RBL, having its gate connected to read out word line RWL.

N channel MOS transistor 103, write word line WWL, and write bit line WBL constitute the first port (write port). N channel MOS transistor 106, readout word line RWL, and readout bit line RBL constitute the second port (readout port). Memory cell 200a has a 2-port SRAM memory cell configuration including a write port and a readout port.

Figure 5:
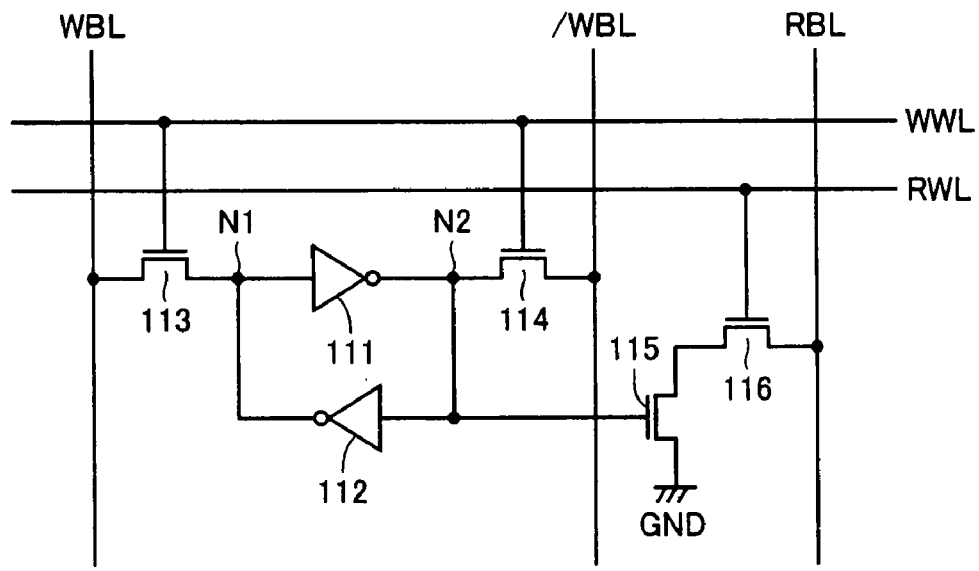
FIG. 5 is a circuit diagram showing a specific configuration of a memory cell 200b of the first embodiment.

FIG. 5 is a circuit diagram showing a specific configuration of memory cell 200b of the first embodiment.

Referring to FIG. 5, memory cell 200b of the first embodiment includes inverters 111, 112 connected in a cyclic manner to each other between storage nodes N1 and N2, an N channel MOS transistor 113 connected between storage node N1 and write bit line WBL, having its gate connected to write word line WWL, an N channel MOS transistor 114 connected between storage node N2 and write bit line /WBL, having its gate connected to write word line WWL, an N channel MOS transistor 115 having a source connected to ground line GND, and a gate connected to storage node N2, and an N channel MOS transistor 116 connected between the drain of N channel MOS transistor 115 and readout bit line RBL, and having its gate connected to read out word line RWL. The ground line is one type of power supply lines.

N channel MOS transistors 113 and 114, write word line WWL, and write bit line pair WBL and /WBL constitute the first port (write port). N channel MOS transistor S115 and S116, readout word line RWL and readout bit line RBL constitute the second port (readout port). Memory cell 200b has a 2-port SRAM memory cell configuration including a write port and a readout port.

Memory cells 200a and 200b are by way of examples, and may be another memory cell with a readout port (for example, a ROM (Read Only Memory) memory cell). The circuit operation of memory cell 200b, representative of the memory cells set forth above, will be described in detail hereinafter.

Figure 6:
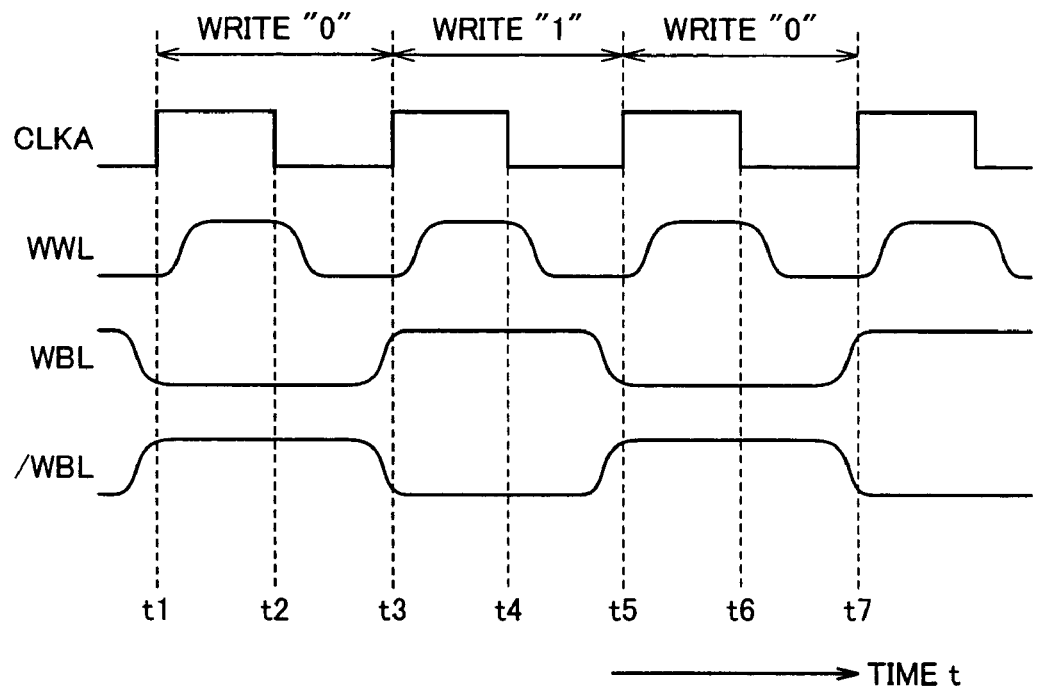
FIG. 6 is an operational waveform diagram to describe a writing operation at a first port of memory cell 200b of the first embodiment.

FIG. 6 is an operational waveform diagram to describe a write operation at the first port of memory cell 200b of the first embodiment.

First, an operation of writing data 0 (L level) into memory cell 200b of FIG. 5 will be described with reference to FIG. 6. By the time of t1 or t5, write bit line pair WBL and /WBL are driven in advance by a drive circuit not shown such that respective potentials attain an L level and an H level. Under this state, write word line WWL is pulled up from an L level to an H level at time t1 or time t5. Accordingly, N channel MOS transistors 113 and 114 (access transistors) are turned on, and electrical connection is established between write bit line WBL and storage node N1 and between write bit line /WBL and storage node N2 (refer to FIG. 5).

Since the pair of write bit lines WBL and /WBL are driven heavily to an L level and an H level, respectively, storage nodes N1 and N2 are driven to an L level and an H level, respectively, irrespective of the previous retaining data. In other words, at time t1–t3 or time t5–t7, 0 is written in memory cell 200b (storage node N1) of FIG. 5.

At time t2 or t6, write word line WWL is pulled down to an L level from an H level. In response, N channel MOS transistors 113 and 114 (access transistors) are turned off, and storage nodes N1 and N2 each become stable at the written potential level to retain data.

Next, an operation of writing data 1 (H level) to memory cell 200b of FIG. 5 will be described. By the time of t3, write bit lines WBL and /WBL forming a pair are driven in advance by a drive circuit (not shown) such that respective potentials attain an H level and an L level. Under this state, write word line WWL is pulled up from an L level to an H level at time t3. In response, N channel MOS transistors 113 and 114 (access transistors) are turned on, and electrical connection is established between write bit line WBL and storage node N1 and between write bit line /WBL and storage node N2.

Since write bit lines WBL and /WBL are driven heavily to an H level and an L level, respectively, storage nodes N1 and N2 are pulled to an H level and an L level, respectively, irrespective of the previous retaining data. In other words, 1 is written into memory cell 200b (storage node N1) of FIG. 5 during time t3–t5.

At time t4, write word line WWL is pulled down to an L level from an H level. In response, N channel MOS transistors 113 and 114 (access transistors) are turned off, and storage nodes N1 and N2 become stable at the written potential level to retain data.

Figure 7:
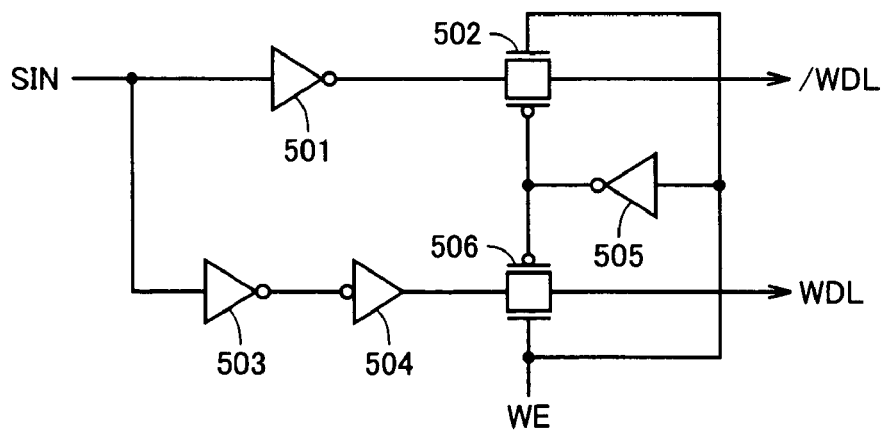
FIG. 7 is a circuit diagram showing a specific configuration of a write driver circuit 54 of the first embodiment.

Referring to FIG. 7, a write driver circuit 54 of the first embodiment includes inverter circuits 501, 503, 504 and 505, and transfer gate circuits 502 and 506.

Inverter circuit 501 inverts an input signal SIN (the output signal from selector 53 or flag signal FLA of FIG. 1). Transfer gate circuit 502 responds to write control signal WE to electrically connect/disconnect the output of inverter circuit 501 with write data line WDL. Inverter circuit 503 inverts input signal SIN. Inverter circuit 504 further inverts the output signal from inverter circuit 503. Inverter circuit 505 inverts write control signal WE and provides the inverted signal to transfer gate circuits 502 and 506. Transfer gate circuit 506 responds to write control signal WE to electrically connect/disconnect the output of inverter circuit 504 and write data line /WDL in synchronization with transfer gate circuit 502.

Referring to FIG. 7, write control signal WE attains an H level, whereby transfer gate circuits 502 and 506 conduct in a write operation. Accordingly, write data lines WDL and /WDL are driven by input signal SIN. In a non-writing mode, write control signal WE attains an L level, whereby transfer gate circuits 502 and 506 are rendered non-conductive. Therefore, write data lines WDL and /WDL are not driven by input signal SIN. Write data lines WDL and /WDL are connected to write bit lines WBL and /WBL forming a pair, corresponding to a column address specified via write port column address signal CAAj.

Figure 8:
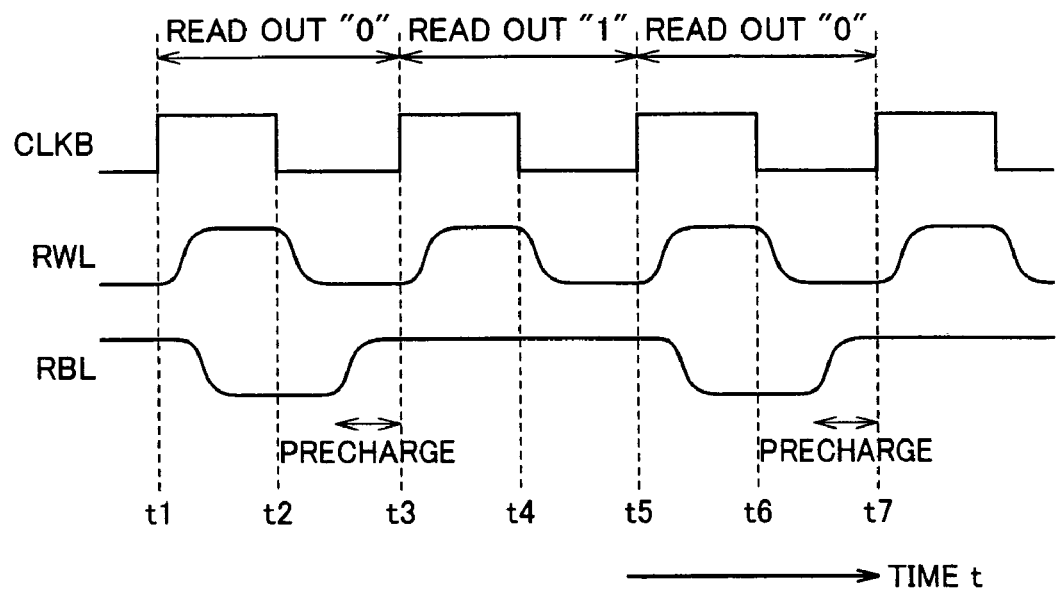
FIG. 8 is an operational waveform diagram to describe a reading operation at a second port of memory cell 200b of the first embodiment.

FIG. 8 is an operational waveform diagram to describe a read out operation at the second port of memory cell 200b of the first embodiment.

First, an operation of reading out data 0 (L level) from memory cell 200b of FIG. 5 will be described with reference to FIG. 8. At this stage, storage nodes N1 and N2 retain an L level and an H level, respectively (refer to FIG. 5). N channel MOS transistor 115 is ON.

By the time of t1 or t5, readout bit line RBL is precharged in advance by a precharge circuit not shown such that the potential attains an H level. Under this state, readout word line RWL is driven to an H level from an L level after time t1 or time t5. In response, N channel MOS transistor 116 is turned on (refer to FIG. 5).

Since N channel MOS transistor 115 is already turned on, readout bit line RBL and ground line GND are electrically connected via N channel MOS transistors 115 and 116. In response, readout bit line RBL is pulled down to an L level from the precharged H level. As a result, during time t1–t3 or time t5–t7, the data stored in memory cell 200b of FIG. 5, i.e. 0 that is the inverted data of storage node N2 (data of storage node N1), is read out.

Then, readout word line RWL is pulled down to an L level from an H level at time t2 or t6. In response, N channel MOS transistor 116 is turned off, whereby readout bit line RBL is electrically cut off from ground line GND. Then, readout bit line RBL is precharged again to an H level by the time of t3 or t7 for the next read out operation.

An operation of reading out data 1 (H level) from memory cell 200b of FIG. 5 will be described hereinafter. At the current stage, storage nodes N1 and N2 retain an H level and an L level, respectively. N channel MOS transistor 115 is OFF.

Readout bit line RBL is precharged in advance by a precharge circuit not shown such that the potential attains an H level by the time of t3. Under this state, readout word line RWL is pulled up to an H level from an L level after time t3. In response, N channel MOS transistor 116 is turned on.

However, readout bit line RBL and ground line GND are still electrically cut off since N channel MOS transistor 115 is OFF. Therefore, readout bit line RBL maintains the precharged H level. As a result, the data stored in memory cell 200b of FIG. 5, i.e. 1 that is the inverted data of storage node N2 (data of storage node N1), is read out at time t3–t5.

At time t4, readout word line RWL is pulled down to an L level from an H level. In response, N channel MOS transistor 116 is turned off. Then, readout bit line RBL is precharged again to an H level by the time of t5 for the next read out operation.

Thus, the potential of readout bit line RBL does not change in level when data 1 (H level) is read out from memory cell 200b of FIG. 5. However, the potential level thereof is altered when data 0 (L level) is read out. In other words, power is not consumed by the charge/discharge of readout bit line RBL when 1 is read out, whereas power is consumed by the charge/discharge of readout bit line RBL when 0 is read out.

Figure 9:
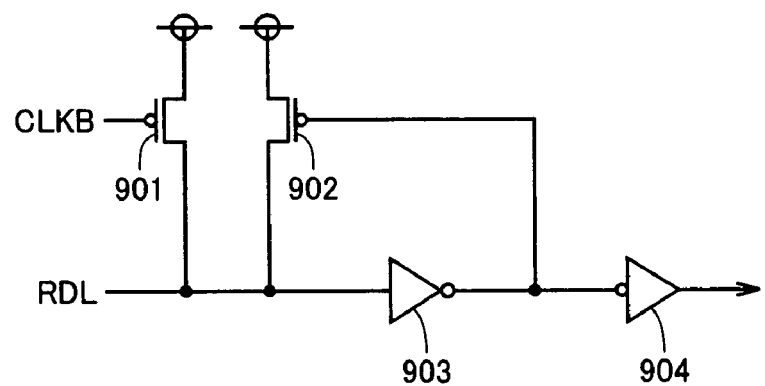
FIG. 9 is a circuit diagram showing a specific configuration of a sense amplifier circuit 91 of the first embodiment.

FIG. 9 is a circuit diagram showing a specific configuration of sense amplifier circuit 91 of the first embodiment.

Referring to FIG. 9, sense amplifier circuit 91 includes P channel MOS transistors 901 and 902, and inverter circuits 903 and 904.

P channel MOS transistor 901 have its source connected to a power supply line, its drain connected to read out data line RDL, and receives readout port clock signal CLKB at its gate. P channel MOS transistor 901 responds to readout port clock signal CLKB to precharge the potential of readout data line RDL to an H level. P channel MOS transistor 902 has its source connected to a power supply line, its drain connected to read out data line RDL, and its gate connected to an output terminal of inverter circuit 903. P channel MOS transistor 902 maintains the potential of readout data line RDL slightly at an H level.

Inverter circuit 903 has its input terminal connected to read out data line RDL to invert an input signal in accordance with the potential level of readout data line RDL. Inverter circuit 904 responds to the output signal from inverter circuit 903 to invert the same, which is output to inverter circuit 93 and selector 94 of FIG. 1. Readout data line RDL is connected to read out bit line RBL corresponding to the column address specified via readout port column address signal CABj.

A standby leakage current in a standby mode in which writing nor reading is carried out in memory cell 200b of FIG. 5 will be described hereinafter.

At N channel MOS transistor 115 of FIG. 5, the leakage current differs greatly depending upon whether the stored data in memory cell 200b is 0 or 1.

When data 0 is stored in memory cell 200b, i.e. when storage nodes N1 and N2 attain an L level and an H level, respectively, N channel MOS transistor 115 is turned on. In response, gate leakage current flows to ground line GND from the gate (storage node N2) of N channel MOS transistor 115. When data 1 is stored in memory cell 200b, i.e. when storage nodes N1 and N2 attain an H level and an L level, respectively, N channel MOS transistor 115 is OFF. Therefore, little, if any, gate leakage current flows.

Although almost no gate leakage current flows when data 1 (H level) is stored in memory cell 200b of FIG. 5 as set forth above, gate leakage current will flow to ground line GND from the gate (storage node N2) of N channel MOS transistor 115 when data 0 (L level) is read out. In other words, almost no power is consumed by the gate leakage current when 1 is read out, whereas power is consumed by gate leakage current when 0 is read out.

Thus, power consumption in a read out mode and a standby mode will differ depending upon whether the stored data in memory cell 200b of FIG. 5 is 0 or 1. In other words, power consumption in a reading mode and a standby mode becomes smaller as there are more memory cells storing 1. The same applies to another memory cell including a readout port (including memory cell 200a of FIG. 4).

In semiconductor memory device 1A of the first embodiment, decision is made of the majority of the number of 0s and the number 1s in data input signal DIn using majority logic decision circuit 51, as described with reference to FIG. 1. By reflecting the decision on flag signal FLA to invert/non-invert data, power consumption can be reduced even in the case where there are many data 0. Details of the theory of operation thereof will be described in detail hereinafter.

Figure 10:
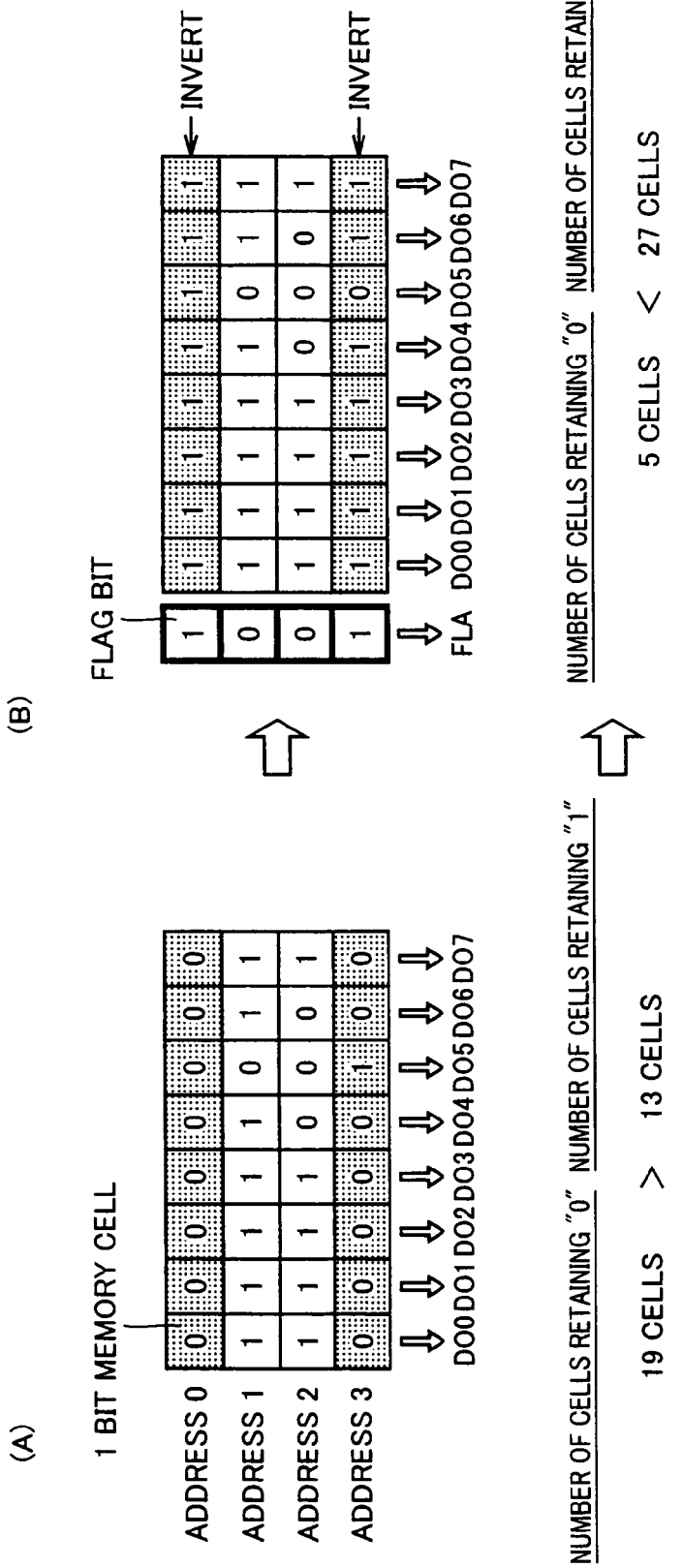
FIG. 10 is a diagram to describe an example of the theory of operation for majority logic decision in semiconductor memory device 1A of the first embodiment.

The diagram of FIG. 10 corresponds to an example of storing 4 words of 8-bit data. Each box in the drawing corresponds to a 1-bit memory cell. FIG. 10 corresponds to a memory cell array of 4 rows and 8 columns, storing data of 4 words×8 bits. Specifically, each row corresponds to the data of 1 word, and each column corresponds to data of 1 bit.

As stated before, power consumption is smaller when the memory cell stores 1 than when the memory cell stores 0. In this context, all the data of 1 word of a 8-bit configuration is inverted when there are more 0s than 1s in the data. In the inverting operation, 1 is written into the flag bit that indicates whether data has been inverted or not. A specific example will be described with reference to FIG. 10.

In FIG. 10, (A) represents input data prior to majority logic decision, whereas (B) represents data including a flag bit after the majority logic decision.

Referring to FIG. 10(A), the input data at address 0 is "00000000", including many 0s. Therefore, the data at address 0 is inverted to "11111111", as shown in FIG. 10(B). At the same time, flag information "1" indicating inversion is written into the flag bit of the same address 0. The input data at address 3 similarly includes many 0s. Therefore, the data is inverted, and flag information "1" is written. The input data at addresses 1 and 2 includes more 1s than 0s. Therefore, the data is not inverted, and flag information "0" is written. With regards to the written data, only the data at an address with a flag signal FLA of 1 is inverted again in a read out mode to be eventually read out as data output signals DO0–DO7.

By the operation set forth above, the number of memory cells retaining "0" among the entire memory cell array of 4 rows and 8 columns can be reduced to 5 cells from the original 19 cells. By inverting and writing data at an address having more 0s than 1s in the input data in a writing mode, and reading out data of the relevant address after inverting the same again based on flag information in a reading mode, the number of memory cells storing 0 can be reduced. As a result, power consumption in a reading mode and standby mode can be reduced.

Figure 11:
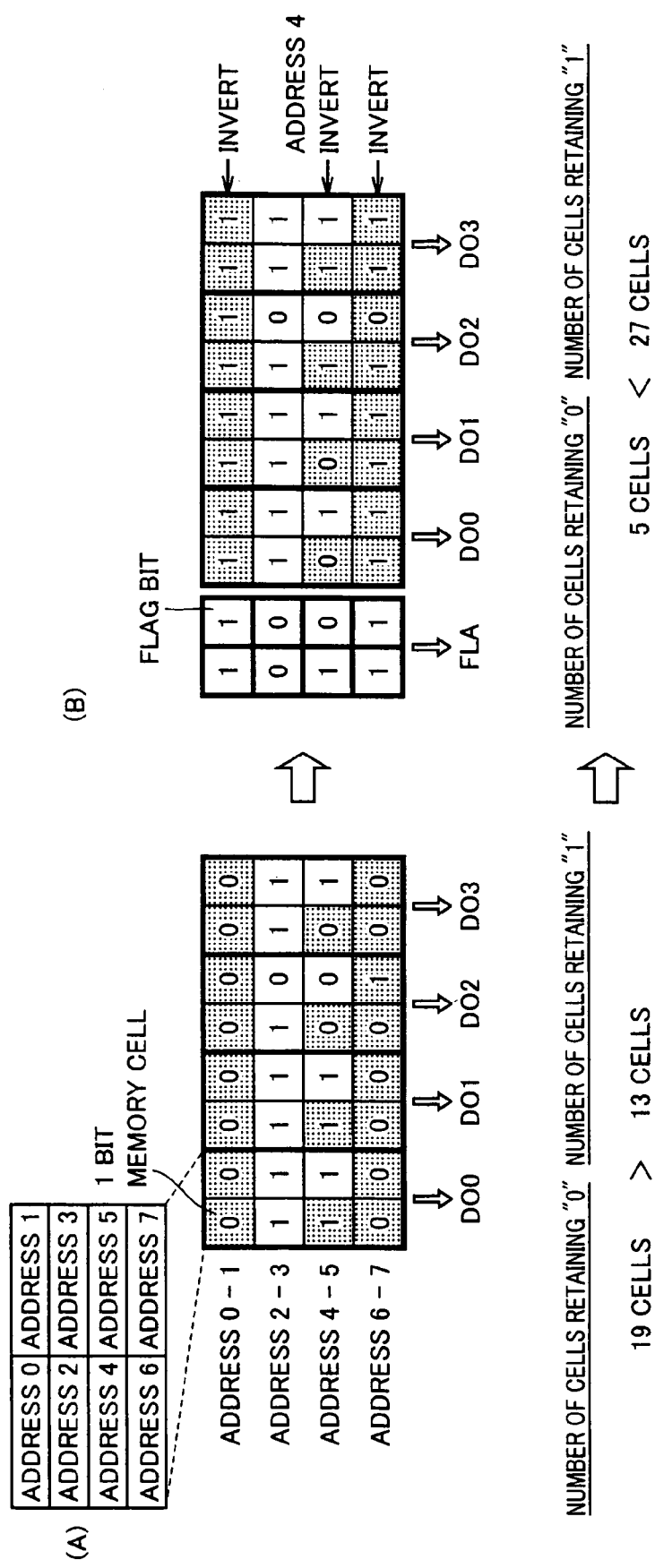
FIG. 11 is a diagram to describe another example of the theory of operation for majority logic decision in semiconductor memory device 1A of the first embodiment.

FIG. 11 is a diagram to describe another example of the theory of operation for majority logic decision in semiconductor memory device 1A of the first embodiment.

The diagram of FIG. 11 is similar to FIG. 10 in that a memory cell array configuration of 4 rows and 8 columns is employed. The diagram of FIG. 11 corresponds to an example where the number of data bits is 4 bits, and data of 8 words×4 bits is stored by providing a column address. Each row corresponds to data of 2 words. Two columns correspond to data of 1 bit. Since a flag bit of 1 bit is provided for each word, the flag bit cell corresponds to the total of 8 cells by 2 rows×4 columns, as shown in FIG. 11(B).

The theory of operation for majority logic decision of FIG. 11 is basically similar to that of FIG. 10. All the data is inverted when there are more 0s than 1s, and 1 is written into the flag bit indicating whether the data has been inverted or not. A specific example will be described with reference to FIG. 11.

In FIG. 11, (A) corresponds to input data prior to majority logic decision, whereas (B) represents data including a flag bit after majority logic decision.

As shown in FIG. 11(A), the input data at address 0 is "0000", including many 0s. Therefore, the data at address 0 is inverted to "1111", as shown in FIG. 11(B). At the same time, flag information "1" indicative of inversion is written into the flag bit of the same address 0. Since the input data at addresses 1, 4, 6 and 7 similarly have many 0s, the data is inverted, and flag information "1" is written. The input data at addresses 2, 3 and 5 has more 0s than 1s. Therefore, the data is not inverted, and flag information "0" is written. With regards to the written data, only the data at an address with a flag signal FLA of 1 is inverted again in a read out mode to be eventually read out as data output signals DO0–DO3.

By virtue of the operation set forth above, the number of memory cells storing "0" among the entire memory cell array of 4 rows and 8 columns can be reduced to 5 cells from the original 19 cells. By inverting and writing data at an address having more 0s than 1s in the input data in a writing mode, and reading out data of the relevant address after inverting the same again based on flag information in a reading mode, the number of memory cells storing 0 can be reduced. As a result, power consumption in a reading mode and standby mode can be reduced.

The diagrams of the theory of operation described with reference to FIGS. 10 and 11 correspond to an example of providing a flag bit of 1 bit for each word for controlling inversion and non-inversion. The theory of operation for majority logic decision in the case where each word is divided into groups of bits, and a flag bit is provided for every divided group of bits will be described hereinafter with reference to FIG. 12.

Figure 12:
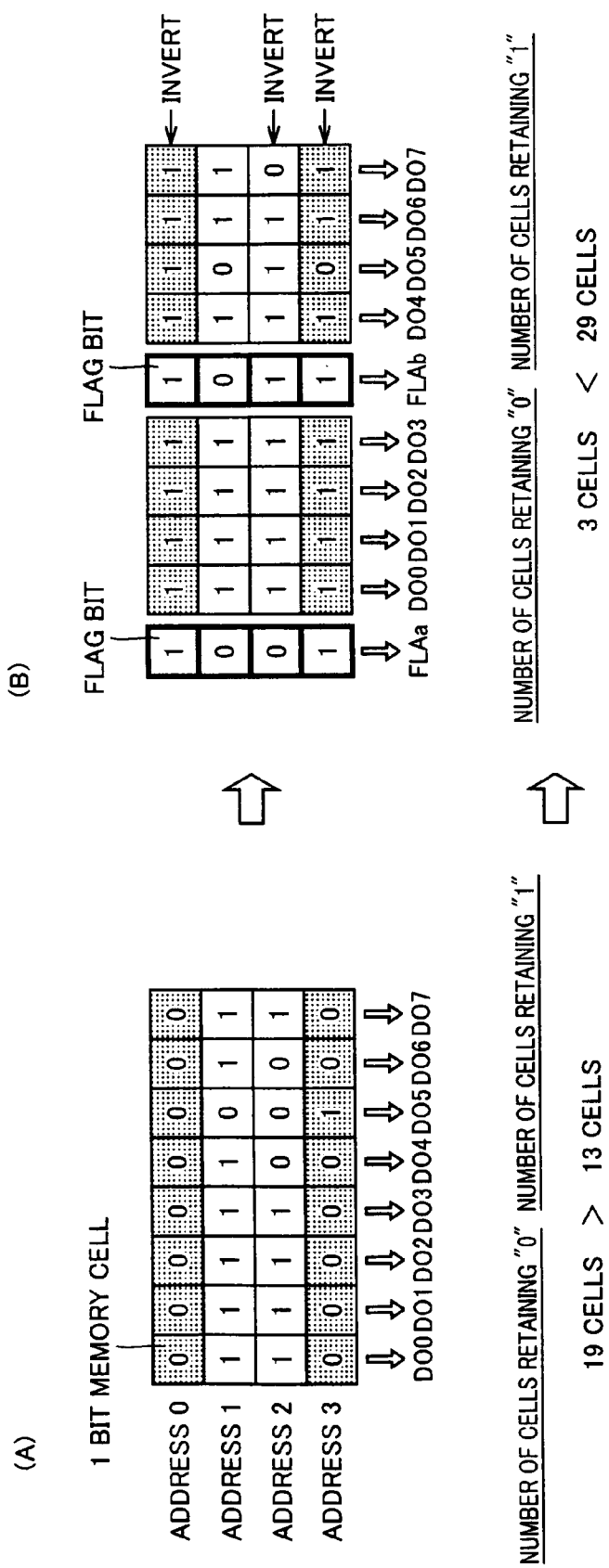
FIG. 12 is a diagram to describe a further example of the theory of operation for majority logic decision in semiconductor memory device 1A of the first embodiment.

FIG. 12 is similar to FIG. 10 in that there are 8 data bits in a memory cell array configuration of 4 rows and 8 columns. FIG. 12 corresponds to a case where the data bits are divided into the high-order 4 bits and the low-order 4 bits. Flag bits FLAa and FLAb are provided for each divided group of bits.

The theory of operation for majority logic decision of FIG. 12 is basically similar to that of FIG. 10. The entire data is inverted when there are more 0s than 1s, and 1 is written into the flag bit indicating whether the data has been inverted or not. A specific example will be described with reference to FIG. 12.

In FIG. 12, (A) represents input data prior to majority logic decision, whereas (B) represents data including a flag bit after majority logic decision has been carried out.

As shown in FIG. 12(A), the high-order 4 bits and the low-order 4 bits in the input data at address 0 are both "0000", including many 0s. Therefore, the data at address 0 has both the high-order 4 bits and the low-order 4 bits inverted to "1111", as shown in FIG. 12(B). At the same time, flag information "1" indicative of inversion is written into both the flag bits for the high-order 4 bits and the low-order 4 bits of the same address 0. The same applies to the input data at address 3. Since both the high-order 4 bits and the low-order 4 bits include many 0s, the data is inverted for both the high-order 4 bits and the low-order 4 bits, and flag information "1" is written into in both flag bits. In contrast, the input data at address 1 includes more 1s than 0s in both the high-order 4 bits and the low-order 4 bits.

Therefore, the data is not inverted for the high-order 4 bits and the low-order 4 bits, and flag information "0" is written into both flag bits.

In input data at address 2, the high-order 4 bits is "1111", including many 1s, whereas the low-order 4 bits is "0001", including many 0s. Therefore, the high-order 4 bits are not inverted and remain at "1111", and flag information "0" is written for the 4 bits of the upper order. In contrast, the low-order 4 bits are inverted to "1110", and flag information "1" is written into the flag bit of the lower bits. With regards to the written data, only the data at an address whose flag signals FLAa and FLAb are "1" is inverted again in a reading mode to be eventually read out as data output signals DO0–DO7.

By the operation set forth above, the number of memory cells storing "0" can be reduced to 3 cells from the original 19 cells in the entire memory cell array of 4 rows and 8 columns. By inverting and writing data at an address having more 0s than 1s in the input data in a writing mode upon dividing the data bits into the groups of the high-order 4 bits and the low-order 4 bits, and reading out data of the relevant address after inverting the same again based on flag information in a reading mode, the number of memory cells storing 0 can be further reduced. As a result, power consumption in a reading mode and standby mode can be further reduced.

FIG. 12 corresponds to the case where the data bit is divided into two groups of the high-order 4 bits and the low-order 4 bits. This is only a way of example, and the power consumption can be further reduced than in the case of FIG. 12 by further dividing the data bits into more groups.

A specific example of reading out data in memory cell array 2b will be described hereinafter with reference to FIG. 3. For example, when data of the first row is to be read out, readout word line RWL1 is selectively rendered active by an address signal. In response, readout word line RWL1 is pulled up to an H level from an L level. The other readout word lines RWL2–RWL16 all attain an L level since they are not selected. By the selective activation of readout word line RWL1m, the data in memory cells 201b, 205b, 211b, 215b, . . . , 241b, and 245b (memory cells 231b and 235b are not explicitly indicated for the sake of convenience, as explained before) arranged in the first column are respectively propagated through readout bit line RBLq (q=00, 01, 10, 11, . . . , 40, 41).

Assuming that there are more 0s than 1s in data input signal DIn of FIG. 1, flag signal FLA corresponds to 1, and an inverted signal of data input signal DIn is written into the specified addresses of data bit memory cell arrays 21b–21b4.

Therefore, the number of memory cells storing "1" in memory cells 201b, 205b, 211b, 215b, . . . , 241b, and 245b connected to read out word line RWL1 is greater than the number of memory cells storing 0. In other words, the number of readout bit lines through which data 1 is propagated among the 8 readout bit lines RBLq (q=00, 01, 10, 11, . . . , 40, 41) corresponding to data bit memory cell arrays 2b1–2b4 becomes greater than the number of readout bit lines through which data "0" is propagated.

In this context, the corresponding readout bit line is pulled down to an L level from an H level when the data stored in the memory cell is 0, as described with reference to FIG. 5. When the data stored in the memory cell is 1, the corresponding readout bit line remains at the H level. In other words, the number of readout bit lines whose potential level does not change can be set greater than the number of readout bit lines whose potential level changes in the read out operation of semiconductor memory device 1A.

If data is directly written without inversion/non-inversion control as in the conventional case, the number of memory cells storing 0 may be greater than the number of memory cells storing 1 For example, a likely extreme case is where all the data input signal DIn is 0, i.e. all the data stored in a plurality of memory cells connected to the same readout bit line is 0. In this case, all the readout bit lines will be pulled down to an L level from an H level in a read out mode. Therefore, the power consumption caused by the charging/discharging current of the bit line is great.

In the first embodiment of the present invention, the number of readout bit lines whose potential level changes can be reduced in a read out operation. Therefore, power consumption caused by the charging/discharging current of bit lines can be reduced as compared to the conventional case.

In semiconductor memory device 1A of the first embodiment, the number of memory cells storing "1" is greater than the number of memory cells storing "0" in the memory cells of each row. This relationship is established over the entire memory cell array. In memory cell 200b of FIG. 5, the standby current corresponding to the storage of 1 is smaller than the standby current corresponding to the storage of 0. Therefore, the standby current can be reduced in semiconductor memory device 1A of the first embodiment. Therefore, the power consumption in a standby mode can be reduced as compared to the conventional case.

By inverting and writing data at an address having more 0s than 1s in the input data in a writing mode, and reading out data of the relevant address after inverting the same again based on flag information in a reading mode, power consumption in a reading mode and standby mode can be reduced.

Second Embodiment

Figure 13:
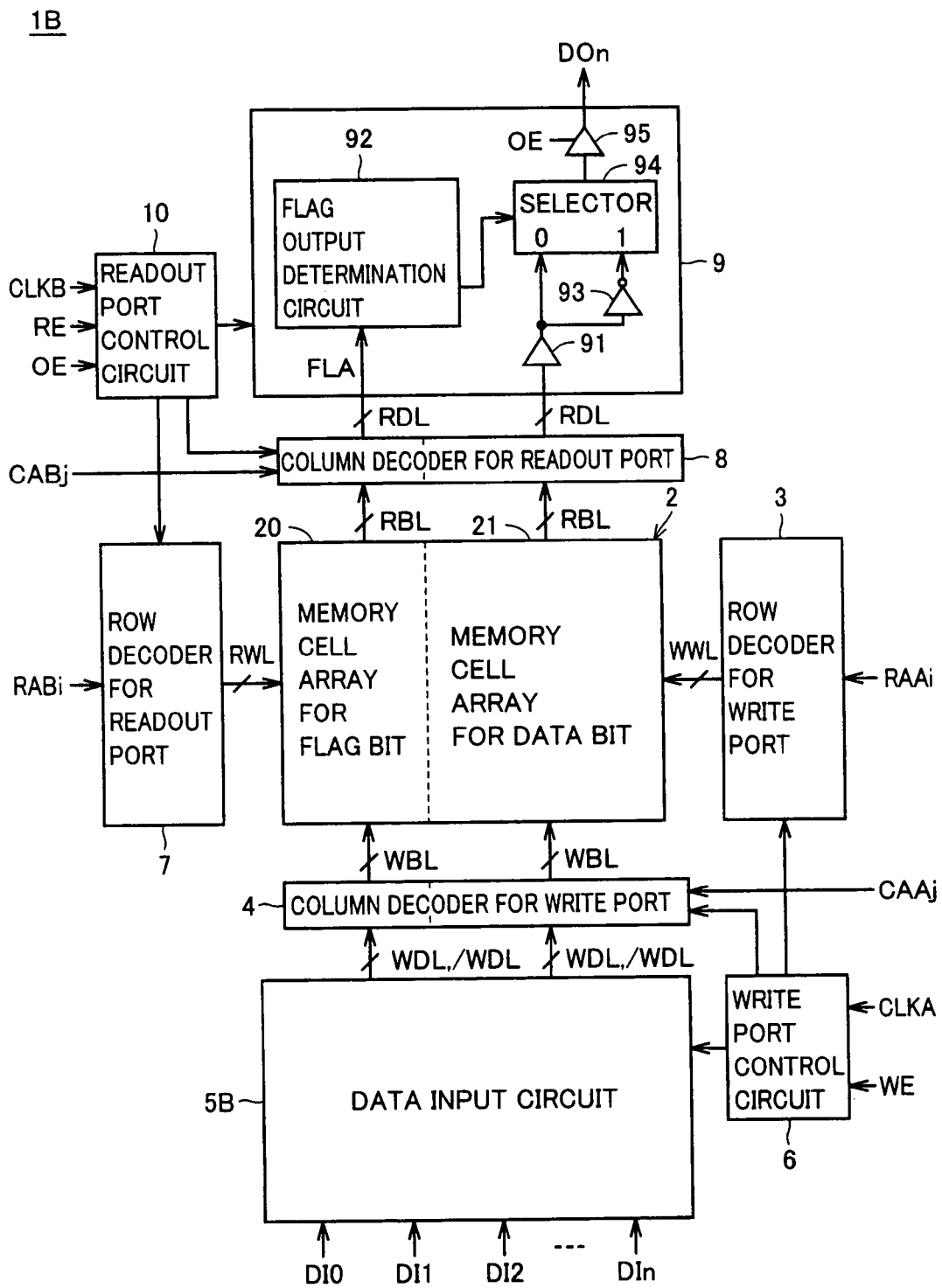
FIG. 13 is a block diagram schematically showing a configuration of a semiconductor memory device 1B according to a second embodiment of the present invention.

Referring to FIG. 13, a semiconductor memory device 1B according to a second embodiment of the present invention differs from semiconductor memory device 1A of the first embodiment only in that data input circuit 5A is replaced with a data input circuit 5B. A detailed configuration of data input circuit 5B will be described hereinafter, and elements common to those of semiconductor memory device 1A will not be repeated.

Figure 14:
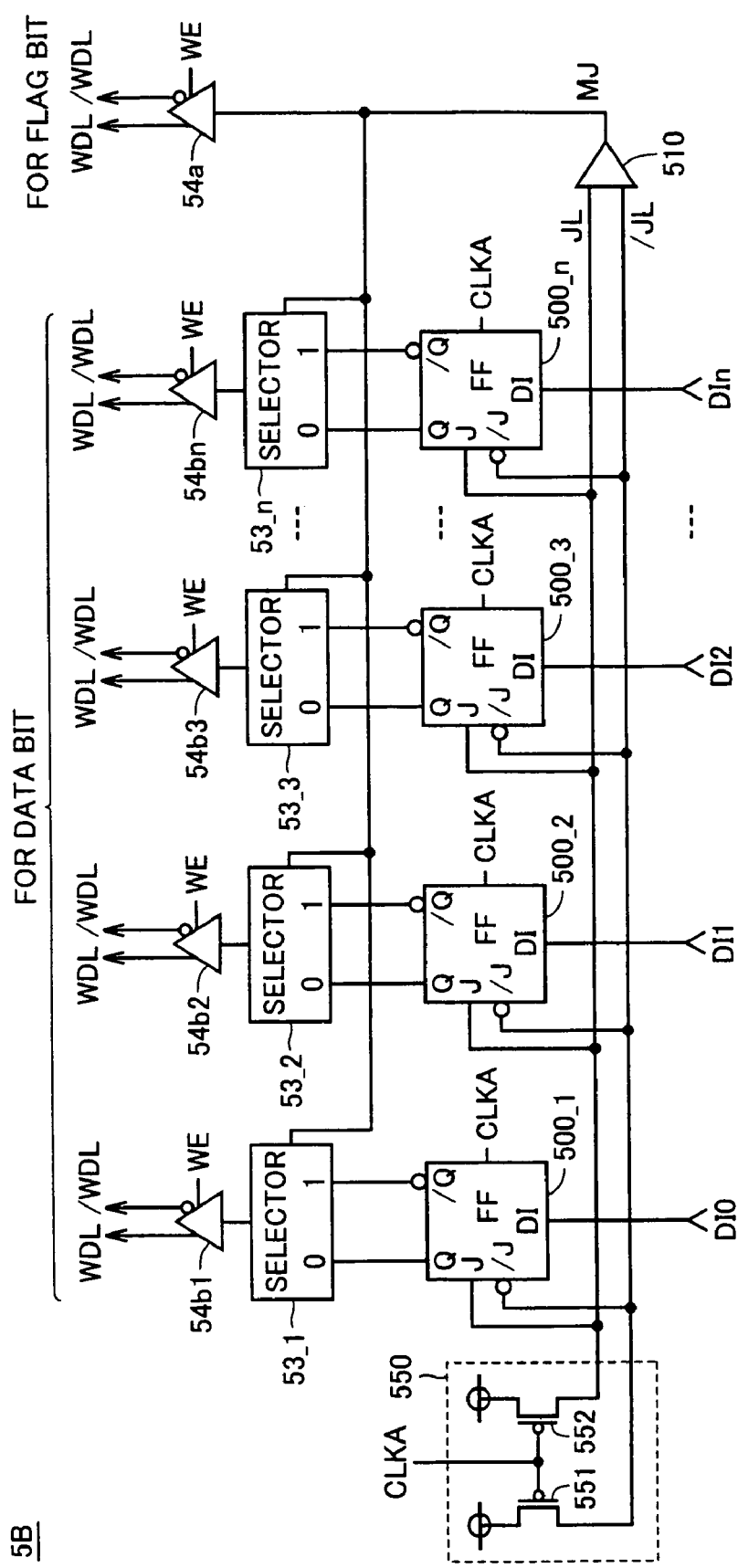
FIG. 14 is a circuit diagram showing a specific configuration of a data input circuit 5B of the second embodiment.

Referring to FIG. 14, data input circuit 5B of the second embodiment includes write driver circuits 54a and 54bk (k=1–n), a selector 53_k, a flip-flop circuit 500_k, a sense amplifier 510 for majority logic decision, and a precharge circuit 550.

Precharge circuit 550 includes P channel MOS transistors 551 and 552 to precharge a pair of majority decision lines JL and /JL to an H level in synchronization with write port clock signal CLKA. Flip-flop circuit 500_k latches data input signal DIk (k=1–n) in synchronization with write port clock signal CLKA and controls the potential level of majority decision lines JL and /JL forming a pair. The configuration and operation of flip-flop circuit 500 representative of flip-flop circuit 500_k will be described in detail afterwards. Data input signal DIk is also generically referred to as "data input signal DI".

Majority logic decision sense amplifier 510 has its input terminal connected to majority decision lines JL and /JL to output a majority logic decision signal MJ in accordance with the potential level of majority decision lines JL and /JL. The configuration and operation of majority logic decision sense amplifier 510 will be described in detail afterwards. Selector 53_k selects one of inverted signal /Q and non-inverted signal Q output from flip-flop circuit 500_*k* in accordance with majority logic decision signal MJ.

When majority logic decision signal MJ attains an L level, selector 53_*k* selects non-inverted signal Q output from flip-flop circuit 500_*k* to output the same to write drive circuit 54*bk*. When majority logic decision signal MJ attains an H level, selector 53_*k* selects inverted signal /Q output from flip-flop circuit 500_*k* to output the same to write driver circuit 54*bk*.

Write driver circuit 54*a* responds to write control signal WE to write majority logic decision signal MJ via write data line pair WDL and /WDL at the specified address in flag bit memory cell array 20 of FIG. 13. Write driver circuit 54*bk* responds to write control signal WE to write non-inverted signal Q or inverted signal /Q output from flip-flop circuit 500_*k* to the specified address in data bit memory cell array 21 of FIG. 13 via write data line pair WDL and /WDL.

Figure 15:
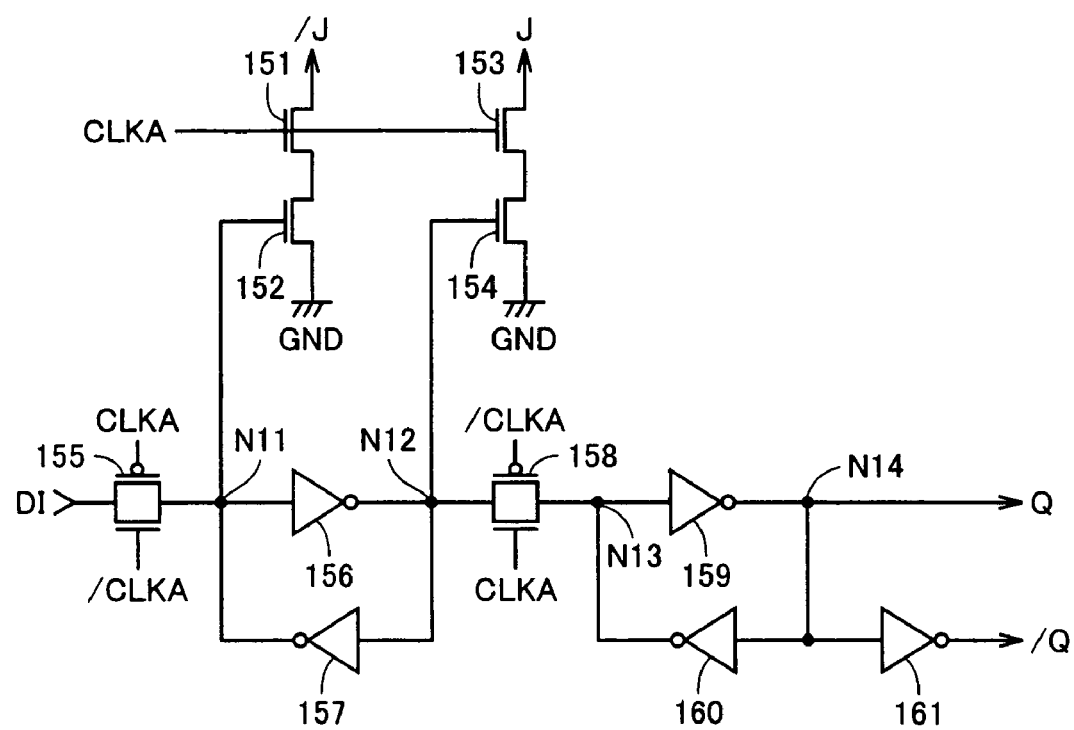
FIG. 15 is a circuit diagram showing a specific configuration of a flip-flop circuit 500 of the second embodiment.

Referring to FIG. 15, a flip-flop circuit 500 of the second embodiment includes N channel MOS transistors 151–154, transfer gate circuits 155 and 158, and inverter circuits 156, 157, 159, 160 and 161.

N channel MOS transistors 151 and 152 are connected in series between a majority decision line terminal /J and ground line GND. N channel MOS transistors 153 and 154 are connected in series between a majority decision line terminal J and ground line GND. The gates of N channel MOS transistors 151 and 153 receive write port clock signal CLKA. N channel MOS transistor 152 has its gate connected to a node N11. N channel MOS transistor 154 has its gate connected to a node N12.

Transfer gate circuit 155 electrically connects the node to which data input signal DI is input with node N11 when write port clock signal CLKA is at an L level, and does not electrically connect the node to which data input signal DI is input with node N11 when write port clock signal CLKA is at an H level. Inverters 156 and 157 are connected in a cyclic manner to each other between nodes N11 and N12, forming a master latch circuit.

Transfer gate circuit 158 establishes conduction between nodes N12 and N13 when write port clock signal CLKA is at an H level, and cuts off node N12 from node N13 when write port clock signal CLKA is at an L level. Inverters 159 and 160 are connected in a cyclic manner to each other between nodes N13 and N14, forming a slave latch circuit. The signal output from inverter 159 corresponds to non-inverted signal Q. Inverter 161 is connected to node N14, and outputs an inverted signal /Q.

As set forth above, flip-flop circuit 500 latches data input signal DI in synchronization with the rising edge of write port clock signal CLKA. For the purpose of majority logic decision as to the majority of the number of 0s and the number of is in data input signal DI, nodes N11 and N12 of the master latch circuit composed of inverters 156 and 157 are connected to N channel MOS transistors 152 and 154, respectively, as shown in FIG. 15.

In response to the transition of write port clock signal CLKA to an H level from an L level, data input signal DI enters the master latch circuit formed of inverters 156 and 157. Subsequently, the terminal to which data input signal DI is input is cut off from the master latch circuit. At the slave latch circuit composed of inverters 159 and 160, conduction is established between nodes N12 and N13. The data input in the master latch circuit is propagated to the slave latch circuit. N channel MOS transistors 151 and 153 for majority logic decision connected to nodes N11 and N12, respectively, of the master latch circuit are both turned on.

Therefore, in response to the transition of write port clock signal CLKA to an L level from an H level, both N channel MOS transistors of either N channel MOS transistors 151 and 152 connected in series or N channel MOS transistors 153 and 154 connected in series are constantly ON. Therefore, either majority decision line terminal J or majority decision line terminal /J always establishes a conducting state with ground line GND.

Then, in response to the transition of write port clock signal CLKA to an L level from an H level, N channel MOS transistors 151 and 153 connected to majority decision line terminals J and /J are both turned off. Therefore, majority decision terminals J and /J attain a non-conducting state with respect to ground line GND.

Figure 16:
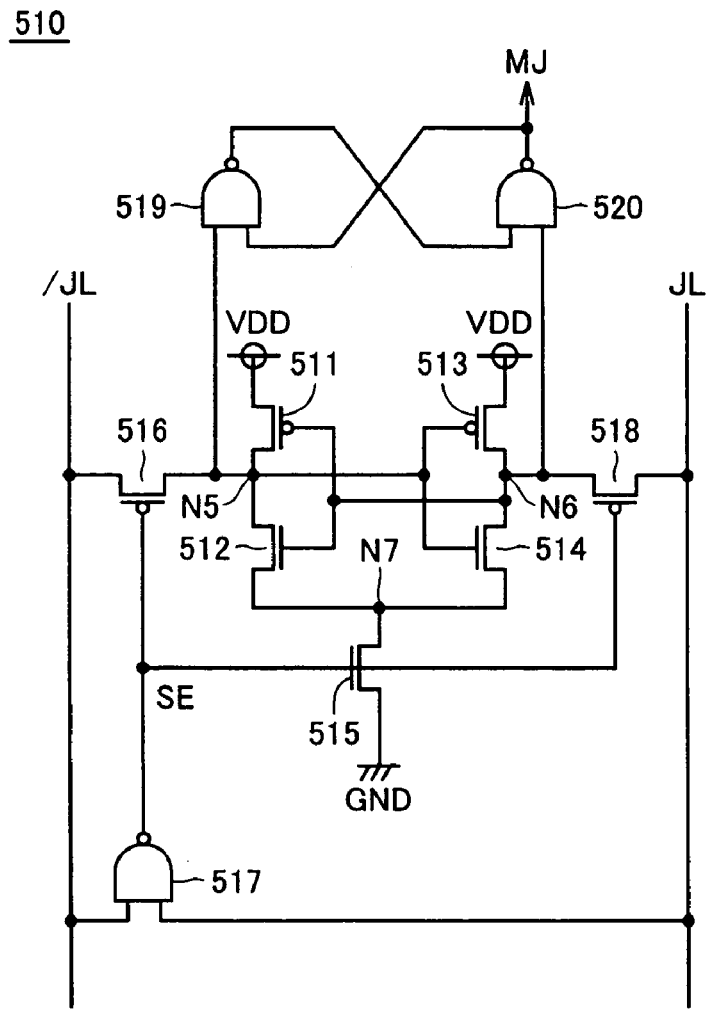
FIG. 16 is a circuit diagram showing a specific configuration of a sense amplifier 510 for majority logic decision of the second embodiment.

Referring to FIG. 16, majority logic decision sense amplifier 510 of the second embodiment includes P channel MOS transistors 511, 513, 516 and 518, N channel MOS transistors 512, 514 and 515, and NAND circuits 517, 519, and 520.

P channel MOS transistor 511 is connected between power supply line VDD and node N5, and has its gate connected to node N6. N channel MOS transistor 512 is connected between nodes N5 and N7, and has its gate connected to node N6. P channel MOS transistor 513 is connected between power supply line VDD and node N6, and has its gate connected to node N5. N channel MOS transistor 514 is connected between nodes N6 and N7, and has its gate connected to node N5. N channel MOS transistor 515 is connected between node N7 and ground line GND, and receives a sense signal SE output from NAND circuit 517 at its gate.

P channel MOS transistor 516 is connected between node N5 and majority decision line /JL, and receives sense signal SE output from NAND circuit 517 at its gate. P channel MOS transistor 518 is connected between node N6 and majority decision line JL, and receives sense signal SE at its gate. P channel MOS transistors 511, 513, 516 and 518, and N channel MOS transistors 512, 514 and 515 constitute a sense latch circuit.

NAND circuit 517 has its input terminal connected to majority decision line pair JL and /JL, and provides sense signal SE to the gate of P channel MOS transistor 516. Sense signal SE is a trigger signal for the sense latch circuit to initiate latching.

NAND circuit 519 has its input terminal connected to node N5 and the output terminal of NAND circuit 520, and has its output terminal connected to one of the input terminals of NAND circuit 520. NAND circuit 520 has its input terminal connected to node N6 and the output terminal of NAND circuit 519, and has its output terminal connected to one input terminal of NAND circuit 519. NAND circuits 519 and 520 are an RS latch circuit to retain sensed data, and outputs majority logic decision signal MJ.

Figure 17:
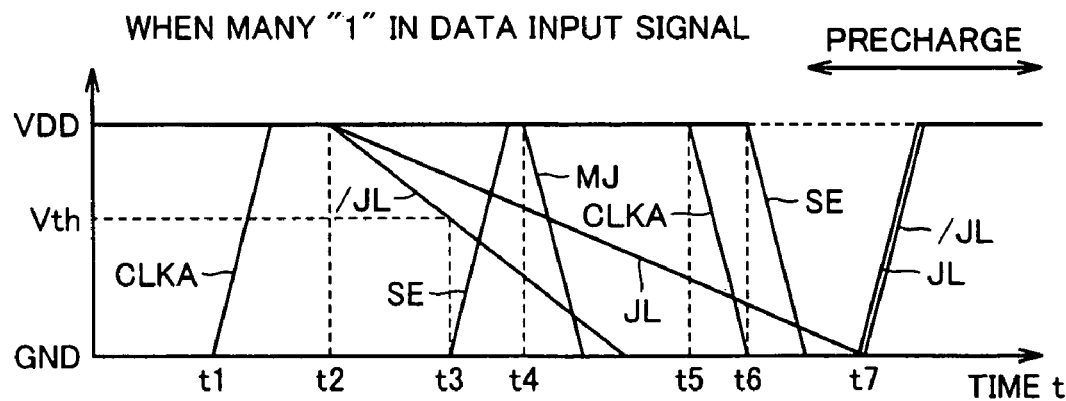
FIG. 17 is an operational waveform diagram to describe the circuit operation of sense amplifier 510 for majority logic decision of the second embodiment.

FIG. 17 is an operation waveform diagram to describe a circuit operation of majority logic decision sense amplifier 510 of the second embodiment.

Referring to FIG. 17, majority decision lines JL and /JL initially attain the precharged level of power supply potential VDD (H level). Sense signal SE attains the level of ground line GND (L level) by NAND circuit 517 of FIG. 16. Therefore, N channel MOS transistor 515 is OFF, and P channel MOS transistors 516 and 518 are ON in FIG. 16. Nodes N5 and N6 both attain an H level. Therefore, majority logic decision signal MJ output from the RS latch circuit formed of NAND circuits 519 and 520 retain the previous decision result.

At time t1, write port clock signal CLKA rises to an H level from an L level, whereby a write operation is initiated. In response to the start of a writing operation, majority decision lines JL and /JL fall in potential from an H level to an L level in accordance with the number of 0s and the number of 1s in data input signal DI of FIG. 15. When there are more 1s than 0s in data input signal DI, majority decision line /JL falls to an L level from an H level earlier than majority decision line JL. In contrast, when there are more 0s than 1s in data input signal DI of FIG. 15, majority decision line JL falls from an H level to an L level earlier than majority decision line /JL. FIG. 17 corresponds to the case where the number of 1s is greater than the number of 0s in the data input signal.

In response to the change in the potential level of majority decision lines JL and /JL, the potential levels of nodes N5 and N6 in the sense latch circuit also vary via P channel MOS transistors 516 and 518. When the potential of one of majority decision lines JL and /JL becomes equal to or lower than the input threshold value of NAND circuit 517 of FIG. 16, sense signal SE output from NAND circuit 517 exhibits a transition to a H level from an L level at time t3. As a result, P channel MOS transistors 516 and 518 of FIG. 16 are turned off, and majority decision lines JL and /JL are cut off from nodes N5 and N6 in FIG. 16.

At this stage, N channel MOS transistor 515 of FIG. 16 is turned on. Therefore, nodes N5 and N6 having a slight potential difference in the vicinity of the intermediate potential level are completely fixed at an H level or an L level. In response to nodes N5 and N6 being ascertained at an H level and an L level, the RS latch circuit formed of NAND circuits 519 and 520 of FIG. 16 output a majority logic decision signal MJ at time t4.

At time t5, write port clock signal CLKA is pulled down to an L level from an H level. At time t6, sense signal SE output from NAND circuit 517 of FIG. 16 is pulled down to an L level from an H level. Therefore, P channel MOS transistors 516 and 518 are turned on, and N channel MOS transistor 515 is turned off. At time t7, majority decision lines JL and /JL are precharged again to an H level, all returning to the initial state. Since nodes N5 and N6 both attain an H level in FIG. 16 at the initial state, the RS latch circuit formed of NAND circuits 519 and 520 attains a latch state. As a result, majority logic decision signal MJ in the RS latch circuit of FIG. 16 is retained.

By replacing data input circuit 5A of the first embodiment with data input circuit 5B in the second embodiment, the power consumption in a reading mode and a standby mode can be reduced. The second embodiment is also advantageous in that delay is not increased even for multi-bit data since data input circuit 5B employs a configuration of detecting a small potential difference for decision.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including data bit memory cells, arranged in rows and columns, storing a plurality of data, each of said data bit memory cells having a data storage unit storing and holding data, and a readout port unit reading out data from said data storage unit, and said memory cell array further including flag bit memory cells, arranged in each row, storing inverted information of storage data of said data bit memory cell,
   a plurality of readout word lines, arranged in a row direction of said memory cell array, connected, in each row, to a readout port of said data bit memory cell and said flag bit memory cell,
   a plurality of readout bit lines, arranged in a column direction of said memory cell array, connected, in each column, to a readout port of said data bit memory cell,
   a data input circuit writing a data indicating that data in a row of said data bit memory cell is an inverted data, to the row of said flag bit memory cell, and writing an inverted data in the row of data input signal, to the row of said data bit memory cell, when the amount of current flowing in said data bit memory cell in the reading operation of said data input signal of one of logic values written in said data bit memory cell is greater than that of said data input signal of the other of logic values, and when the number of one of logic values is greater than the number of the other of logic values in the row of said data input signal,
   a data output circuit reading out an inverted data in a row of said data bit memory cell, when data of said flag bit memory cell is the data indicating an inversion of the data in the row.

2. The semiconductor memory device according to claim 1, wherein said data input circuit comprises
   a majority logic decision circuit comparing the number of one of logic values with the number of the other of logic values in said data input signal and inverting or non-inverting a signal in the row of said flag bit memory cell in accordance with a result of said comparison,
   a selector circuit selecting one of an inverted signal and a non-inverted signal of said data input signal in accordance with a signal of said flag bit memory cell, and
   a write driver circuit writing an output signal from said selector circuit to said data bit memory cells in accordance with a write control signal.

* * * * *